United States Patent
Solaro et al.

(10) Patent No.: US 9,666,577 B2
(45) Date of Patent: May 30, 2017

(54) ON-SOI INTEGRATED CIRCUIT EQUIPPED WITH A DEVICE FOR PROTECTING AGAINST ELECTROSTATIC DISCHARGES

(71) Applicants: Commissariat à l'énergie atomique et aux énergies alternatives, Paris (FR); STMicroelectronics SA, Montrouge (FR); Centre National de la Recherche Scientifique, Paris (FR)

(72) Inventors: Yohann Solaro, Grenoble (FR); Sorin Cristoloveanu, Seyssinet Pariset (FR); Claire Fenouillet-Beranger, Voiron (FR); Pascal Fonteneau, Theys (FR)

(73) Assignees: Commissariat à l'énergie atomique et aux énergies alternatives, Paris (FR); STMicroelectronics SA, Mountrouge (FR); Centre National De La Recherche Scientifique, Paris (FR)

( * ) Notice: Subject to any disclaimer, the term of this patent is extended or adjusted under 35 U.S.C. 154(b) by 0 days.

(21) Appl. No.: 14/450,597

(22) Filed: Aug. 4, 2014

(65) Prior Publication Data

US 2015/0061023 A1     Mar. 5, 2015

(30) Foreign Application Priority Data

Aug. 5, 2013 (FR) ...................................... 13 57769

(51) Int. Cl.
*H01L 27/02* (2006.01)
*H01L 27/12* (2006.01)
(Continued)

(52) U.S. Cl.
CPC ...... *H01L 27/0262* (2013.01); *H01L 27/1203* (2013.01); *H01L 29/1012* (2013.01);
(Continued)

(58) Field of Classification Search
CPC .............. H01L 27/1203; H01L 29/747; H01L 27/0817; H01L 29/1012; H01L 29/7436;
(Continued)

(56) References Cited

U.S. PATENT DOCUMENTS 6,074,899 A * 6/2000 Voldman ............. H01L 27/0255
257/E27.112
7,298,008 B2 * 11/2007 Gauthier, Jr. ........... H01L 21/84
257/119
(Continued)

FOREIGN PATENT DOCUMENTS

DE     102006022105    11/2007

OTHER PUBLICATIONS

Noel et al., "UT2B-FDSOI Device Architecture Dedicated to Low Power Design Techniques," 2010 Proceedings of the European Solid-State Device Research Conference (ESSDERC) (2010).

*Primary Examiner* — Latanya N Crawford
(74) *Attorney, Agent, or Firm* — Occhiuti & Rohlicek LLP

(57) ABSTRACT

The invention relates to an IC with an electrostatic discharge protection device. There is a buried insulant layer 50 nm or less in thickness and first and second bipolar transistors on the insulant layer, one being an npn transistor and the other a pnp transistor. The base of the first transistor is merged with the collector of the second transistor and the base of the second transistor is merged with the collector of the first transistor. The first and second bipolar transistors are configured to selectively conduct a discharge current between two electrodes of the protection device. There is a first semiconductor ground plane under the insulant layer, being electrically biased, extending until it is plumb with the base of the first bipolar transistor, exhibiting a first type of doping
(Continued)

identical to that of the base of the first bipolar transistor with a doping density at least ten times greater.

16 Claims, 9 Drawing Sheets

(51) Int. Cl.
*H01L 29/66* (2006.01)
*H01L 29/747* (2006.01)
*H01L 29/78* (2006.01)
*H01L 29/423* (2006.01)
*H01L 29/74* (2006.01)
*H01L 29/749* (2006.01)
*H01L 29/10* (2006.01)

(52) U.S. Cl.
CPC .. *H01L 29/42308* (2013.01); *H01L 29/66477* (2013.01); *H01L 29/747* (2013.01); *H01L 29/749* (2013.01); *H01L 29/7436* (2013.01); *H01L 29/78* (2013.01); *H01L 29/7833* (2013.01)

(58) Field of Classification Search
CPC ............... H01L 27/082; H01L 27/0281; H01L 27/0262; H01L 27/0275; H01L 27/0647; H01L 27/0921; H01L 27/1028
See application file for complete search history.

(56) References Cited

U.S. PATENT DOCUMENTS

| | | | |
|---|---|---|---|
| 7,316,941 B1 * | 1/2008 | Gupta | H01L 27/1027 257/E21.35 |
| 7,573,077 B1 * | 8/2009 | Ershov | H01L 21/84 257/146 |
| 7,791,102 B2 | 9/2010 | Salman et al. | |
| 7,791,139 B2 * | 9/2010 | Wahl | H01L 21/84 257/347 |
| 8,455,949 B2 * | 6/2013 | Gossner | H01L 27/0262 257/355 |
| 2003/0007301 A1 | 1/2003 | Ker et al. | |
| 2005/0212051 A1 | 9/2005 | Jozwiak et al. | |
| 2007/0170512 A1 * | 7/2007 | Gauthier, Jr. | H01L 21/84 257/357 |
| 2007/0262386 A1 * | 11/2007 | Gossner | H01L 27/0262 257/355 |
| 2009/0026542 A1 | 1/2009 | Wahl | |
| 2009/0309129 A1 * | 12/2009 | Domanski | H01L 27/0262 257/133 |
| 2010/0230719 A1 * | 9/2010 | Sawahata | H01L 27/0259 257/173 |
| 2012/0187525 A1 * | 7/2012 | Abou-Khalil | H01L 27/0262 257/507 |
| 2013/0134477 A1 * | 5/2013 | Gauthier, Jr. | H01L 27/0262 257/139 |
| 2013/0285111 A1 * | 10/2013 | Di Sarro | H01L 21/84 257/107 |

* cited by examiner

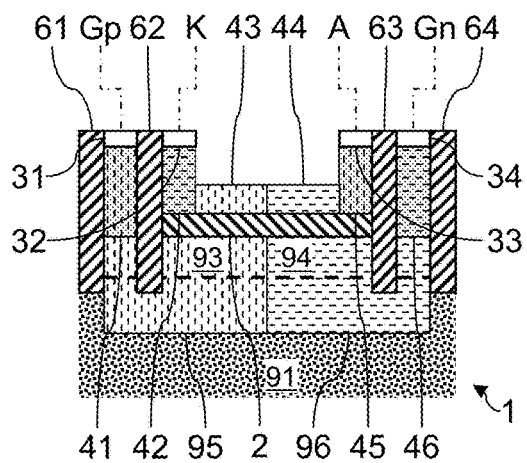
Fig. 4
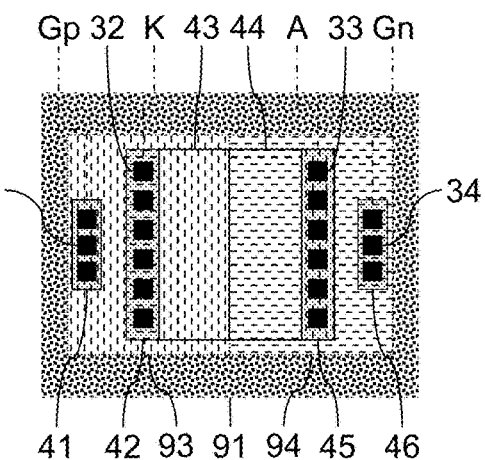
Fig. 5
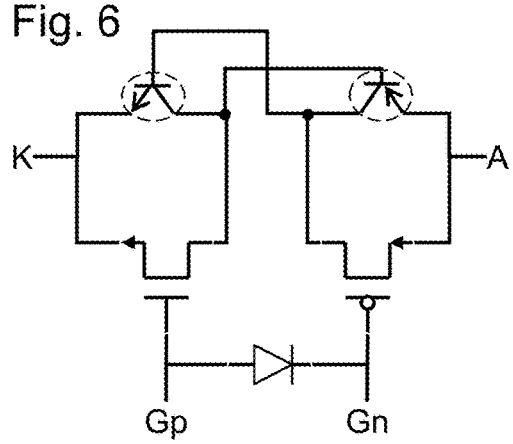
Fig. 6

US 9,666,577 B2

ON-SOI INTEGRATED CIRCUIT EQUIPPED WITH A DEVICE FOR PROTECTING AGAINST ELECTROSTATIC DISCHARGES

RELATED APPLICATIONS

Under 35 USC 119, this application claims the benefit of the Aug. 5, 2013 priority date of French application FR 1357769, the content of which is herein incorporated by reference in its entirety.

FIELD OF INVENTION

The invention relates to integrated circuits, and in particular to integrated circuits produced on a substrate of silicon-on-insulator (SOI) type. SOI technology consists in separating a slender layer of silicon (a few nanometers) on a silicon substrate by a relatively thick layer of insulant (a few tens of nanometers as a general rule).

BACKGROUND

Integrated circuits produced by SOI technology exhibit a certain number of advantages. Such circuits generally exhibit lower electrical consumption for equivalent performance. Such circuits generally induce lower parasitical capacitances, which make it possible to improve the switching speed. Moreover, the phenomenon of parasitic triggering ("latch-up") encountered by MOS transistors in Bulk technology can be avoided. Such circuits therefore turn out to be particularly suitable for applications of SoC or MEMS type. It is also noted that SOI integrated circuits are less sensitive to the effects of ionizing radiations and therefore turn out to be more reliable in applications where such radiations may induce operational problems, in particular in space applications. SOI integrated circuits can in particular comprise random-access memories of SRAM type or logic gates.

In a known manner, such integrated circuits also include devices for protecting against accidental electrostatic discharges (ESD) that can impair these transistors.

The design of an ESD device is produced to observe certain technological restrictions. FIG. 1 is an example of a current-voltage diagram of an ESD device during a discharge. Upon the appearance of an electrostatic discharge, the voltage across the terminals of the ESD device first increases to a trigger voltage Vt1. The current passing through the ESD device therefore increases slightly (low leakage). This voltage Vt1 must remain below a voltage Vm, corresponding to a breakdown voltage in MOS technology, typically of 2.6 V for FDSOI with a technological node of 28 nm. The voltage Vt1 is also greater than a supply voltage Vdd of the various circuits in order to avoid accidental triggering of the ESD device. The voltage Vt1 is thus typically above a voltage of 1.1*Vdd.

When the triggering voltage Vt1 is reached, the ESD device is triggered. Firstly, the voltage across the terminals of the ESD device can decrease, the current passing through it continuing to rise. Secondly, the voltage across the terminals of the ESD device increases, in the same way as the current passing through it in order to short-circuit the electrostatic discharge current. In this second step, the ESD device must exhibit as low an on-resistance as possible, in order to exhibit as high a maximum short-circuit current It2 as possible for a voltage below the voltage Vm.

Moreover, the ESD device must generally have as low a leakage current as possible before being triggered in order to reduce the electricity consumption of the integrated circuit.

ESD devices often occupy a non-negligible surface region of the integrated circuit, which it is desirable to minimize. Moreover, the fabrication process of an ESD device must entail a minimum of additional steps to avoid excessively increasing the cost of the integrated circuit.

The document US20050212051 describes an ESD device comprising a pnp bipolar transistor and an npn bipolar transistor, formed on a thick layer of buried insulant. Base contacts are formed by heavily doped side regions. An additional circuit provides control of discharge currents on base contacts.

This ESD device does exhibit several drawbacks, however. An additional circuit is required to ensure the control of discharge current by way of the MOS transistor, which entails a drop in integration density and increased complexity of the integrated circuit. Such an ESD device furthermore exhibits a great complexity of interconnection, and requires the optimization of the doping of the bases, which therefore entails the use of a large number of photolithographic masks.

The document U.S. Pat. No. 7,791,102 describes an ESD device comprising a pnp bipolar transistor and an npn bipolar transistor, formed on a thick buried insulant layer. The base of the pnp transistor is connected to the collector of the npn transistor. The collector of the pnp transistor is connected to the base of the npn transistor. A MOS transistor is formed on the npn transistor and connected between the collector and the emitter of this transistor. The MOS transistor makes it possible to limit the maximum voltage across the terminals of the ESD device, makes it possible to control the amplitude of the discharge current and makes it possible to limit the leakage current.

This ESD device does however exhibit several drawbacks. An additional circuit is necessary to ensure the control of the discharge current by way of the MOS transistor, which entails a drop in integration density and increased complexity of the integrated circuit. Moreover, this circuit exhibits deteriorated reliability, linked to the dimensions of the gate oxide of the MOS transistor formed on the npn transistor. The presence of the MOS transistor furthermore entails a reduction in thickness of the npn and pnp transistors, and consequently an increase in the on-resistance during the triggering of the ESD device. Such an ESD device furthermore exhibits a great complexity of interconnection, and requires the optimization of the doping of the bases, which therefore entails the use of a large number of photolithographic masks.

There is a need for an integrated circuit including a device for protecting against electrostatic discharges solving one or more of these drawbacks.

SUMMARY OF INVENTION

The invention thus concerns an integrated circuit comprising a device for protecting against electrostatic discharges, comprising:

a buried insulant layer consisting of a thickness less than or equal to 50 nm;

first and second bipolar transistors arranged on the buried insulant layer, one of these bipolar transistors being an npn transistor, the other of these bipolar transistors being a pnp transistor, the base of the first bipolar transistor being merged with the collector of the second bipolar transistor and the base of the second bipolar transistor being merged with the collector of the first bipolar transistor, the first and second bipolar transistors being configured for selectively conducting a discharge current between two electrodes of the protection device;

a first semiconductor ground plane arranged under the buried insulant layer, suitable for being electrically biased, extending plumb with the base of the first bipolar transistor, exhibiting a first type of doping identical to that of the base of the first bipolar transistor and exhibiting a doping density at least ten times greater than that of the base of the first bipolar transistor.

In a variant, the doping density in the base of the first bipolar transistor is less than or equal to $10^{18}$ cm$^{-3}$.

In another variant, the bases of the first and second bipolar transistors are formed in a semiconductor layer exhibiting a thickness less than or equal to 15 nm.

In another variant, the integrated circuit comprises a second semiconductor ground plane arranged under the buried insulant layer, electrically biased, exhibiting a second type of doping and extending plumb with the base of the second bipolar transistor, said first and second types of doping being different.

In yet another variant, said first and second ground planes are in contact.

In a variant, the respective projections of the first and second ground planes on the buried insulant layer include the respective projections of the bases of the first and second bipolar transistors on the buried insulant layer.

In yet another variant, the integrated circuit furthermore comprises an electrically insulating element, this element separating the first and second ground planes and being arranged plumb with the junction between the base of the first bipolar transistor and the base of the second bipolar transistor.

In another variant, said first bipolar transistor has no electrode in contact with its base.

In yet another variant, the upper faces of the bases and of the emitters of said first and second bipolar transistors are flush.

In a variant, the integrated circuit furthermore comprises an FDSOI transistor formed on said buried insulant layer and a semiconductor ground plane arranged under said buried insulant layer plumb with said FDSOI transistor.

The invention also relates to a process for fabricating an integrated circuit comprising a device for protecting against electrostatic discharges, comprising:
the implantation of a first type of doping in a semiconductor substrate arranged under a buried insulant layer, the buried insulant layer exhibiting a thickness less than or equal to 50 nm, so as to form a first ground plane,
the formation of first and second bipolar transistors including one npn transistor and one pnp transistor on the buried insulant layer, the base of the first transistor exhibiting the first type of doping and the respective bases of the first and second bipolar transistors being merged with the respective collectors of the second and first bipolar transistors, the base of the first bipolar transistor being formed plumb with the first ground plane, the doping of the base of the first transistor being performed during the implantation of the first type of doping for the formation of said first ground plane, the doping density at the end of the implantation in the first ground plane being at least ten times greater than that of the base of the first bipolar transistor.

In a variant, the method comprises steps of:
forming an electrode electrically connected to said first ground plane;
interconnecting said electrode with a bias circuit.

In another variant, the doping density in the base of the first transistor after forming the interconnect with the bias circuit is less than or equal to $10^{18}$ cm$^{-3}$.

In yet another variant, the first and second bipolar transistors are formed in a semiconductor layer arranged on said buried insulant layer, the process comprising steps of implanting dopant in the semiconductor layer, these implanting steps being subsequent to the implantation for the formation of said first ground plane, the base of the first bipolar transistor being masked during each of these subsequent implanting steps.

In yet another variant, the fabrication process has no step of forming an electrode in contact with the base of said first bipolar transistor.

Other features and advantages of the invention will become clearly apparent from the description given hereinafter, for information purposes and in no way limiting, with reference to the appended drawings.

BRIEF DESCRIPTION OF THE DRAWINGS

FIGS. 2 to 4 are transverse sectional views of different variants of a first embodiment of a device for protecting against electrostatic discharges according to the invention;

FIG. 5 is a schematic top view of the protection device in FIGS. 2 and 3;

FIG. 6 is an electric circuit diagram equivalent to the protection device of FIGS. 2 to 4;

DETAILED DESCRIPTION

The invention proposes an integrated circuit equipped with a device for protecting against electrostatic discharges. The protection device comprises first and second bipolar transistors formed on a buried insulant layer of UTBOX type, the thickness of which is less than or equal to 50 nm. These transistors are configured for selectively conducting a discharge current between two electrodes of the protection device. The base and the collector of the first bipolar transistor are merged with the collector and the base of the second bipolar transistor respectively. These bipolar transistors are configured for selectively conducting a discharge current between two electrodes of the protection device.

A first semiconductor ground plane (also commonly called back gate) is arranged under the buried insulant layer and is electrically biased. The first ground plane is arranged plumb with the base of the first bipolar transistor and exhibits a type of doping identical to that of this base. The doping density of this first ground plane is at least 10 times greater than that of the base of the first bipolar transistor, advantageously at least 50 times greater.

Such a device for protecting against electrostatic discharges makes it possible to dispense with an optimization of the base of one of the bipolar transistors, due to the electrostatic control of this base by the first ground plane. Such a protection device furthermore makes it possible to use a relatively low bias potential of the first ground plane to produce this electrostatic control.

It turns out that such a device for protecting against electrostatic discharges exhibits a very small leakage current, even using the same bias level(s) of the ground planes as for the powering of the other circuits of the integrated circuit. Moreover, such a device for protecting against electrostatic discharges exhibits a small on-resistance and a high maximum discharge current, and without requiring any complex control circuit. Such a device for protecting against electrostatic discharges can also be produced without involving excessively complex interconnects. With an appropriate fabrication process, it is thus possible to reduce the number of photolithographic masks required, by producing the base of the first bipolar transistor during the implantation of the dopant of the first ground plane.

Figure 1:
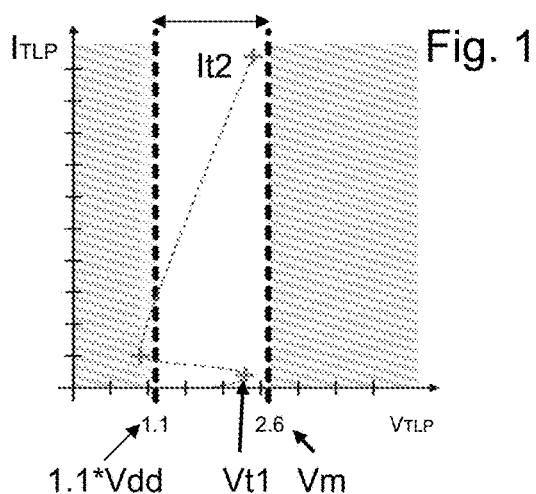
FIG. 1 is an example of a current-voltage diagram of an ESD device of the prior art during a discharge.
Figure 2:
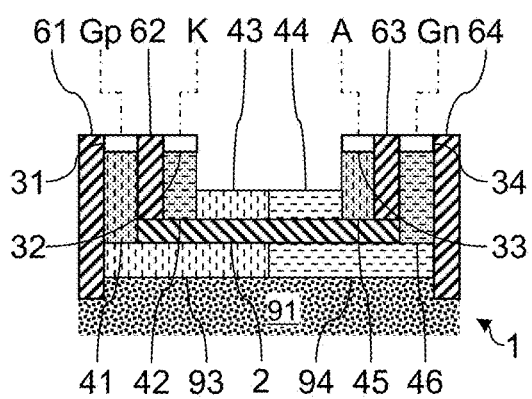

FIG. 2 is a transverse sectional view of an integrated circuit 1, at the level of a device for protecting against electrostatic discharges in a first variant of a first embodiment of the invention. The integrated circuit 1 includes other electronic components not illustrated here.

The protection device is formed plumb with a semiconductor substrate 91. This substrate 91 has p-doping for example. The protection device includes a bipolar transistor of npn type and a bipolar transistor of pnp type.

The npn transistor includes an emitter 42, a collector 44 and a base 43. The emitter 42 includes an n-doped semiconductor element, the collector 44 comprises an n-doped semiconductor element, and the base 43 comprises a p-doped semiconductor element. The pnp transistor includes an emitter 45. This emitter 45 includes a p-doped semiconductor element. The base of the pnp transistor is merged with the collector 44 of the npn transistor (it will therefore be denoted by the reference number 44), and the collector of the pnp transistor is merged with the base 43 of the npn transistor, a thyristor being thus formed. The emitters 42 and 45 advantageously exhibit $N^+$-doping and $P^+$-doping respectively. The emitters 42 and 45 and the bases 43 and 44 are formed in a semiconductor layer (here made of silicon) arranged on a buried insulant layer 2 exhibiting a thickness less than or equal to 50 nm. In the present description the term insulation should be understood to mean electrical insulation. The npn and pnp transistors are advantageously coplanar. The term coplanar should be understood to mean that a plane can be defined passing through the emitters, bases and collectors of these transistors, this plane being parallel with the buried insulant layer 2. The semiconductor layer typically exhibits a thickness of less than or equal to 15 nm, preferably equal to 10 nm, and advantageously less than or equal to 7 nm. Such a semiconductor layer thickness facilitates the electrostatic control of the bases 43 and 44 by ground planes 93 and 94. These thicknesses typically correspond to the thickness of a semiconductor layer on the buried insulant layer 2 before an epitaxial re-growth.

The emitters 42 and 45 are respectively connected to electrodes K and A of the device for protecting against electrostatic discharges. Metallic contacts 32 and 33 are for this purpose in contact with the emitters 42 and 45 respectively. The npn and pnp transistors are thus configured for selectively conducting a discharge current between the electrodes K and A, as detailed hereinafter.

The device for protecting against electrostatic discharges furthermore comprises a first semiconductor ground plane 93 and a second semiconductor ground plane 94. The first and second ground planes 93 and 94 are arranged under the buried insulant layer 2. The first ground plane 93 extends until it is plumb with the base 43. The first ground plane 93 exhibits a doping of identical type to that of the base 43, therefore p-doping. The second ground plane 94 extends until it is plumb with the base 44. The second ground plane 94 exhibits a doping of identical type to that of the base 44, therefore n-doping. The ground planes 93 and 94 are electrically biased. The electrical bias of the ground plane 93 is applied by way of a region 41 implanted with p-doping (and advantageously with $P^+$-doping) and by way of a metallic contact 31. A bias Gp is applied to the metallic contact 31 by way of a bias circuit not illustrated here. The electrical bias of the ground plane 94 is applied by way of a region 46 implanted with n-doping (and advantageously with $N^+$-doping) and by way of a metallic contact 34. A bias Gn is applied to the metallic contact 34 by way of the bias circuit.

The device for protecting against electrostatic discharges advantageously includes at its periphery insulation trenches 61 and 64 extending depth-wise to the substrate 91. The protection device furthermore advantageously includes an insulation trench 62 separating the emitter 42 from the implanted region 41. The insulation trench 62 extends depth-wise to the buried insulant layer 2. The protection device furthermore advantageously includes an insulation trench 63 separating the emitter 45 from the implanted region 46. The insulation trench 63 extends depth-wise to the buried insulant layer 2. In this variant, the insulation trenches 61 and 64 extend more deeply than the insulation trenches 62 and 63. The ground planes 93 and 94 extend under the insulation trenches 62 and 63 respectively, until they come into contact with the implanted regions 41 and 46 respectively. The use of insulation trenches of different depths makes it possible to reduce the number of implanting steps, the bias of the ground planes 93 and 94 by electrodes then requiring a smaller number of implanting steps.

FIG. 5 is a top view of the device for protecting against electrostatic discharges. Out of a concern for legibility, the insulation trenches 61 to 64 are not illustrated.

The doping density of the bases 43 and 44 is at least ten times lower than the doping density of the ground planes 93 and 94 respectively. Such doping can be obtained during the respective implantations of the ground planes 93 and 94. Thus, during an implantation of a ground plane, with a maximum implantation depth arranged under the buried insulant layer 2, the density of doping of the same type in the semiconductor arranged on the buried insulant layer 2 is sufficient to form a base of a bipolar transistor. The lower the residual doping of the bases 43 and 44 at the end of this implantation, the more voltage levels of low bias can be applied to the ground planes 93 and 94. The doping of the bases 43 and 44 typically exhibits a density of less than $10^{18}$ $cm^{-3}$, preferably of less than $5*10^{17}$ $cm^{-3}$. To increase the influence of the electrostatic control of a ground plane on the base arranged plumb with it, the buried insulant layer advantageously exhibits a thickness less than or equal to 25 nm, or even less than or equal to 15 nm.

In this variant, the upper face of the bases 43 and 44 is in recess with respect to the upper face of the emitters 42 and 45. The formation of the emitters 42 and 45 can for example be continued during an epitaxial re-growth phase to form emitters 42 and 45 that are higher than the bases 43 and 44.

FIG. 6 is an approximation of the electrical circuit diagram equivalent to the device for protecting against electrostatic discharges of the first embodiment.

The respective biases applied to the ground planes 93 and 94 make it possible to ensure electrostatic control of the bases 43 and 44. This electrostatic control makes it possible, on the one hand, to reduce the leakage current when the protection device is not activated and also to modulate the respective triggering voltages of the npn and pnp transistors in the event of an electrostatic discharge, in particular in the absence of electrodes driving one or both of the bases 43 and 44.

In a first operating mode corresponding to the mode of protection against electrostatic discharges, the bias circuit can apply a voltage Gnd to the ground plane 93 and to the ground plane 94, particularly when the doping of the bases 43 and 44 is less than $10^{18}$ cm$^{-3}$. The triggering of the npn and pnp transistors is then not blocked to allow triggering in the presence of an electrostatic discharge. It is then possible to adjust the triggering threshold voltage by modifying the amplitude of a value Vp and by applying −Vp to the ground plane 93 and +Vp to the ground plane 94. The higher the value of Vp, the more the triggering voltage of the npn and pnp transistors is raised. Due to the fact of the electrostatic control obtained with the ground planes 93 and 94, the triggering voltage can be fixed using a low value of Vp, typically less than or equal to a voltage Vdd powering the logic circuits or the memory circuits of the integrated circuit 1. It is also possible to apply a voltage Gnd to the ground plane 93 and a voltage +Vp to the ground plane 94. It is also possible to apply a negative voltage Vp1 to the ground plane 93 and a positive voltage Vp2 to the ground plane 94, with different amplitudes for Vp1 and Vp2. The behaviour of the protection device in the event of the appearance of an electrostatic discharge can therefore be easily adjusted.

In a second operating mode corresponding to the normal operating mode of the integrated circuit, the bias circuit can apply the voltage −Vdd to the ground plane 93 and the voltage Vdd to the ground plane 94, Vdd being for example equal to 1 V. Thus, despite the very weak doping of the bases 43 and 44, a very low leakage current passes through them during normal operation of the integrated circuit 1. The doping of the majority carriers in the bases 43 and 44 can however be defined as being high enough (for example close to $10^{18}$ cm$^{-3}$) to reduce the leakage current passing through them with even lower bias levels of the ground planes.

Figure 3:
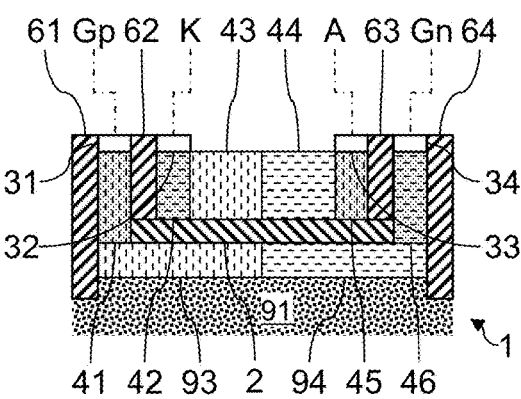

FIG. 3 is a transverse sectional view of a second variant of a device for protecting against electrostatic discharges of the first embodiment. This variant reproduces all the features of the first variant, the only difference being that the upper faces of the bases 43 and 44 are flush with the upper faces of the emitters 42 and 45. The formation of the bases 43 and 44 and the emitters 42 and 45 can for example be continued in one and the same epitaxial re-growth phase. Such a variant makes it possible to reduce as much as possible the conduction resistance through the bases 43 and 44 and thus to increase the maximum intensity of a short-circuit in the event of an electrostatic discharge. The thickness of the bases 43 and 44 resulting from epitaxial re-growth is advantageously less than or equal to 25 nm, and preferably less than or equal to 22 nm, in order to preserve optimal electrostatic control of the bases 43 and 44 by the ground planes 93 and 94.

Advantageously, an annealing step makes it possible to diffuse the dopants of each of the bases 43 and 44 in their upper part obtained by epitaxy.

FIG. 4 is a transverse sectional view of a third variant of a device for protecting against electrostatic discharges of the first embodiment. This variant reproduces all the features of the first variant, the insulation trenches 62 and 63 extending more deeply than the ground planes 93 and 94, to the same depth as the insulation trenches 61 and 64. In this variant:

a well 95 is furthermore formed in the substrate 91 plumb with the ground plane 93. The well 95 extends under the insulation trench 62. The well 95 forms a p-doped semiconductor element linking the ground plane 93 to the implanted region 41;

a well 96 is furthermore formed in the substrate 91 plumb with the ground plane 94. The well 96 extends under the insulation trench 63. The well 96 forms an n-doped semiconductor element linking the ground plane 94 to the implanted region 46.

According to the first embodiment, the ground planes 93 and 94 are in contact. To avoid a forward conduction of the diode formed between the ground planes 93 and 94, the bias voltage Gp is at most equal to the bias voltage Gn. According to this first embodiment, the ground planes 93 and 94 have respective projections (along the normal to the buried insulant layer) onto the buried insulant layer 2 which include the respective projections of the bases 43 and 44 onto this buried insulant layer. In this way the electrostatic control of the ground planes 93 and 94 is maximized on the bases 43 and 44.

In the various illustrated variants of the first embodiment, the bases 43 and 44 are without metallic contact or electrode contact.

Advantageously, the dopant concentration of the emitters 42 and 45 is at least equal to $10^{20}$ cm$^{-3}$, preferably, at least equal to $5*10^{20}$ cm$^{-3}$, and advantageously at least equal to $10^{21}$ cm$^{-3}$. Advantageously, the dopant concentration of the bases 43 and 44 is between $5*10^{16}$ cm$^{-3}$ and $5*10^{17}$ cm$^{-3}$.

The other electronic components of the integrated circuit 1 can for example comprise transistors of FDSOI type, arranged on the same buried insulant layer 2 as the protection device. These FDSOI transistors can be arranged plumb with the respective biased ground planes arranged under the buried insulant layer 2. In this technology, the doping of the transistor channel is almost zero (typically of $10^{15}$ cm$^{-3}$).

FIGS. 18 to 25 are transverse sectional views of an integrated circuit 1 according to the third variant of the first embodiment of the invention, during different steps of an example of a fabrication process.

Figure 18:
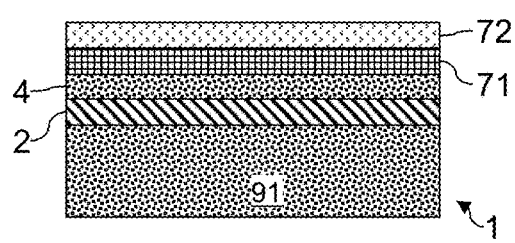
FIGS. 18 to 25 are transverse sectional views of an integrated circuit according to the third variant of the first embodiment of the invention, during various steps of an example of a fabrication process.

In FIG. 18, there is provided a buried insulant layer 2 arranged on a semiconductor substrate 91 (typically made of silicon). A semiconductor layer 4 (typically a slender layer of silicon exhibiting a thickness of less than or equal to 10 nm, or even less than or equal to 7 nm) is arranged on the buried insulant layer 2. A hard oxide mask 71 is typically formed on the layer 4. The hard mask 71 exhibits a composition and a thickness known per se. A nitride layer 72 is typically formed on the hard mask 71. The nitride layer 72 exhibits a composition and a thickness known per se.

Figure 19:
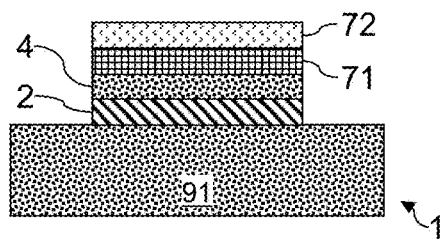

In FIG. 19, the integrated circuit 1 is shaped by photolithography in such a way as to keep the nitride 72, the hard mask 71, the layer 4 and the insulating layer 2 in the region in which one desires to form the npn and pnp transistors of the protection device. The layers of nitride 72 and of hard mask 71 are removed, notably in the regions where one wishes to form transistors of Bulk type by removing the buried insulant layer 2.

Figure 20:
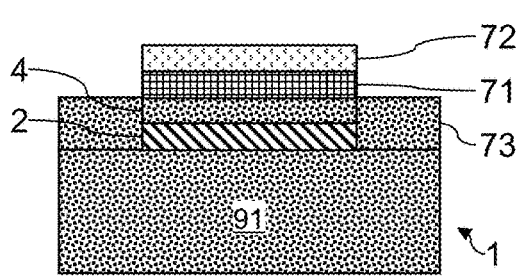

In FIG. 20, an epitaxy is advantageously carried out for the possible Bulk regions of the integrated circuit 1. The epitaxy is for example produced to form a semiconductor silicon layer 73 flush with the layer 4.

Figure 21:
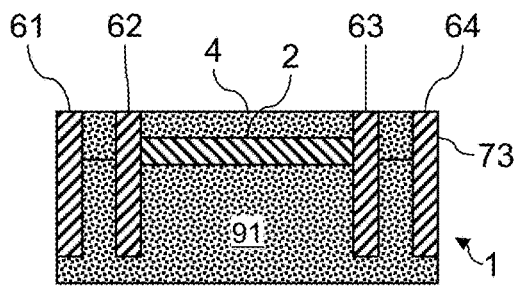

In FIG. 21, the hard mask 71 and the nitride layer 72 are removed. Insulation trenches 62 and 63 are formed and extend into the substrate 91 to the periphery of the layer 4. Insulation trenches 61 and 64 are formed and extend into the substrate 91. The insulation trenches 61 and 64 exhibit in this variant the same depth as the insulation trenches 62 and 63. A semiconductor element extends between the insulation trenches 61 and 62 up to the substrate 91. A semiconductor element extends between the insulation trenches 63 and 64 up to the substrate 91. The materials (silicon oxide for example) and the depths of the insulation trenches 61 to 64 are known per se.

In a variant of the sequence of steps 18 to 21, one may proceed as follows:

There is provided a buried insulant layer 2 arranged on a semiconductor substrate 91. A semiconductor layer 4 is arranged on the buried insulant layer 2.

Insulation trenches 62 and 63 are formed and extend into the substrate 91 to the periphery of the layer 4. Insulation trenches 61 and 64 are formed and extend into the substrate 91. The insulation trenches 61 and 64 exhibit in this variant the same depth as the insulation trenches 62 and 63. A semiconductor element extends between the insulation trenches 61 and 62 up to the substrate 91. A semiconductor element extends between the insulation trenches 63 and 64 up to the substrate 91. The materials (for example silicon oxide) and the depths of the insulation trenches 61 and 64 are known per se.

A hard oxide mask 71 is then formed on the layer 4. A nitride layer 72 is then formed on the hard mask 71.

The integrated circuit 1 is then shaped by photolithography in such a way as to keep the nitride 72, the hard mask 71, the layer 4 and the insulant layer 2 in the region in which one desires to form the npn and pnp transistors of the protection device. The layers of nitride 72 and of hard mask 71 are removed notably in the regions where one wishes to form transistors of Bulk type by removing the buried insulant layer 2.

Optionally, an epitaxy is performed for any possible Bulk regions of the integrated circuit 1. The epitaxy is for example performed to form a semiconductor silicon layer 73 flush with the layer 4.

Figure 22:
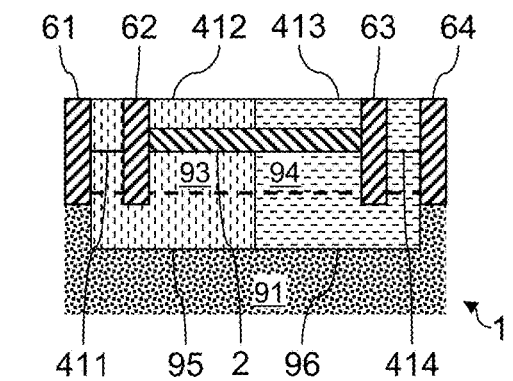

In FIG. 22, the implantation of a p-doped ground plane 93 has been performed under the buried insulant layer 2 on the one hand, and the implantation of an n-doped ground plane 94 has been performed under the buried insulant layer 2. The implantation of the ground plane 93 is typically performed with a dose of between $10^{12}$ cm$^{-2}$ and $10^{14}$ cm$^{-2}$ of indium, and an energy between 110 and 180 keV. The implantation of the ground plane 94 is typically performed with a dose between $10^{12}$ cm$^{-2}$ and $10^{14}$ cm$^{-2}$ of arsenic, and an energy between 90 and 150 keV. The implantation energies are of course adjusted as a function of the thickness of the layer 2 and of the film 4.

Moreover, a p-doped well 95 has been implanted under the ground plane 93 and extends under the insulation trench 62 into the semiconductor element arranged between the insulation trenches 61 and 62. An n-doped well 96 has been implanted under the ground plane 94 and extends under the insulation trench 63 into the semiconductor element arranged between the insulation trenches 63 and 64.

Although the implantation of the ground plane 93 is configured to exhibit a maximum density of implantation under the buried insulant layer 2 and in this ground plane 93, this implantation also leads to p-doping in the layer 4 plumb with the ground plane 93 (region 412) and in the upper part of the semiconductor element present between the insulation trenches 61 and 62.

In the same way, although the implantation of the ground plane 94 is configured to exhibit a maximum density of implantation under the buried insulant layer 2 and in this ground plane 94, this implantation also leads to n-doping in the layer 4 plumb with the ground plane 94 (region 413) and in the upper part of the semiconductor element present between the insulation trenches 63 and 64.

Figure 23:
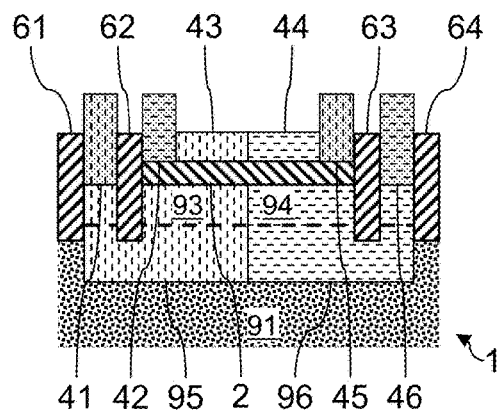

In FIG. 23, an epitaxial re-growth has been performed to increase the thickness of silicon on the semiconductor element present between the insulation trenches 61 and 62, on the semiconductor element present between the insulation trenches 63 and 64, on a part of the region 412 in contact with the trench 62, and on a part of the region 413 in contact with the trench 63. The regions on which one does not wish to perform epitaxy are typically protected by a hard mask (not illustrated). An implanted region 41 is formed by P$^+$-doping, the emitter 42 is formed by N$^+$-doping, the emitter 45 is formed by P$^+$-doping and the implanted region 46 is formed by N$^+$-doping.

At the end of the steps illustrated in FIG. 23, there is thus provided:

a base 43 having the same type of doping as the ground plane 93, but with a doping density at least 10 times smaller;

a base 44 having the same type of doping as the ground plane 94 and with a doping density at least 10 times smaller.

In this way the structure of the npn and pnp bipolar transistors and of the corresponding thyristor is provided. For the remainder of the process, the doping of at least one of the bases formed during the implantation of one of the ground planes is retained. The doping of at least one of the two bases is therefore performed during the implantation of its ground plane. The residual doping of this base at the end of the implantation of its ground plane typically exhibits a density of less than $10^{18}$ cm$^{-3}$, preferably of less than $5*10^{17}$ cm$^{-3}$. Thus, at least one of the two bases is not subject to an implantation, by maintaining for example at least one of these two bases masked in any subsequent implantation step.

Figure 25:
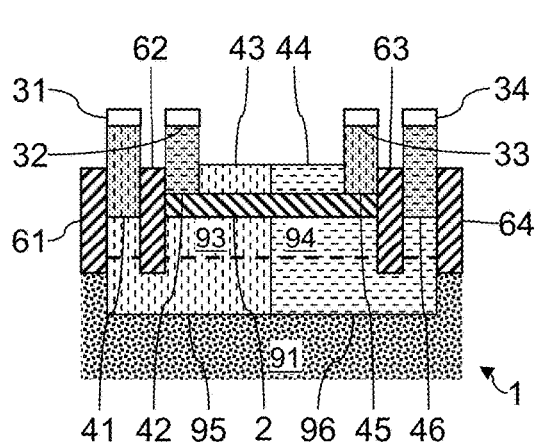

In FIG. 25, starting from the structure obtained in FIG. 23:

a protection mask has been defined by defining the sites of the metallic bias contacts;

a siliconization has been carried out;

metal has been deposited to form metallic contacts 31 to 34 respectively on the implanted region 41, the emitter 42, the emitter 45 and the implanted region 46;

the protective mask has been removed.

In subsequent steps, interconnects are produced with the metallic contacts 31 to 34. For example, the metallic contacts 31 and 34 are connected to a bias circuit. At this stage, the doping in the bases 43 and 44 still corresponds to the doping at the end of the implantation of the ground planes 93 and 94.

It will be noted that the advantages of an integrated circuit 1 obtained using such a fabrication process did not necessarily lead to a complication of the fabrication process. Indeed, such a fabrication process makes it possible to use one and the same mask for the implantation of dopants in one base and in one ground plane.

Figure 24:
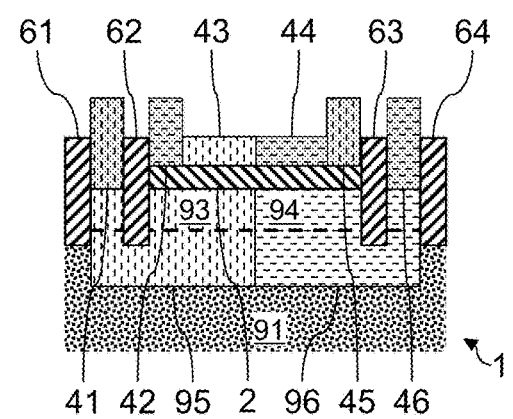

In FIG. 24, a variant is illustrated in which the base 44 of the structure obtained in FIG. 23 is subject to an additional implantation of LDD type (lowly doped drain, for a doping typically comprised between $10^{18}$ cm$^{-3}$ and $10^{19}$ cm$^{-3}$).

Figure 7:
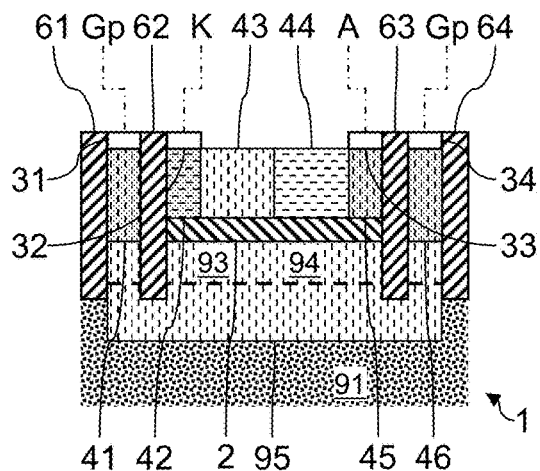
FIGS. 7 to 10 are transverse sectional views of different variants of a second embodiment of a device for protecting against electrostatic discharges according to the invention.

FIG. 7 is a transverse sectional view of an integrated circuit 1, at the level of a device for protecting against electrostatic discharges according to a first variant of a second embodiment of the invention. The integrated circuit 1 includes other electronic components not illustrated here.

This variant reproduces all the features of the third variant of the first embodiment, the main differences being that:

the ground planes 93 and 94 are merged into one p-doped semiconductor element extending under the bases 43 and 44 and under the emitters 42 and 45;

the wells 95 and 96 are replaced by one continuous p-doped well 95 extending under the ground planes 93 and 94, and under the insulation trenches 62 and 63 into the semiconductor elements arranged between the insulation trenches 61 and 62 and between the insulation trenches 63 and 64 respectively.

The doping density of the base 43 is at least 10 times smaller than the doping density of the ground plane 93. The doping density of the base 44 can also be at least 10 times smaller than the doping density of the ground plane 94. The doping of the base 43 being of the same type as that of the ground plane 93, its doping can be obtained during the implantation of the ground plane 93. Thus, during the implantation of the ground plane 93, with a maximum depth of implantation arranged under the buried insulant layer 2, the doping density of the same type in the semiconductor arranged under the buried insulant layer 2 is sufficient to form the base 43.

The doping of the base 44 being of an opposite type to that of the ground plane 94, the base 44 is subject to an n-doped implantation after the implantation of the ground planes 93 and 94. The doping of the base 44 can typically be doping of LDD type. The doping density of the base 44 is typically greater than the doping density of the base 43.

The second embodiment makes it possible to produce the ground planes 93 and 94 during one and the same implantation step. Moreover, the fabrication process and the control of the protection device are simplified, since one and the same bias voltage is applied to the ground planes 93 and 94, preferably with the same metallic contact.

In this variant of the second embodiment, the electrostatic control of the base 43 by the ground plane 93 is prevalent with respect to the electrostatic control of the base 44 by the ground plane 94.

Figure 8:
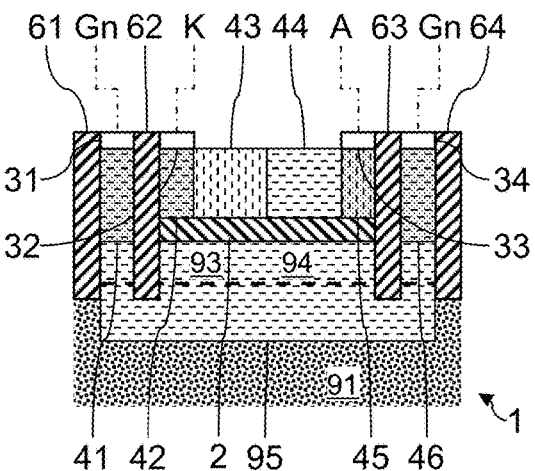

FIG. 8 is a transverse sectional view of a second variant of the device for protecting against electrostatic discharges of the second embodiment. This variant reproduces all the features of the first variant, the main differences being that:

the ground planes 93 and 94 are merged into one n-doped semiconductor element extending under the bases 43 and 44 and under the emitters 42 and 45;

the well 95 is replaced by one continuous n-doped well 95 extending under the ground planes 93 and 94, and under the insulation trenches 62 and 63 into the semiconductor elements arranged between the insulation trenches 61 and 62 and between the insulation trenches 63 and 64 respectively.

The doping density of the base 44 is at least 10 times smaller than the doping density of the ground plane 94. The doping density of the base 43 can also be at least 10 times smaller than the doping density of the ground plane 93. The doping of the base 44 being of the same type as that of the ground plane 94, the doping of the base 44 can be obtained during the implantation of the ground plane 94. Thus, during the implantation of the ground plane 94, with a maximum depth of implantation arranged under the buried insulant layer 2, the doping density of the same type in the semiconductor arranged on the buried insulant layer 2 is sufficient to form the base 44.

The doping of the base 43 being of an opposite type to that of the ground plane 93, the base 43 is subject to a p-doped implantation after the implantation of the ground planes 93 and 94. The doping of the base 43 can typically be doping of LDD type. The doping density of the base 43 is then typically greater than the doping density of the base 44.

In this variant of the second embodiment, the electrostatic control of the base 44 by the ground plane 94 is prevalent with respect to the electrostatic control of the base 43 by the ground plane 93.

Figure 9:
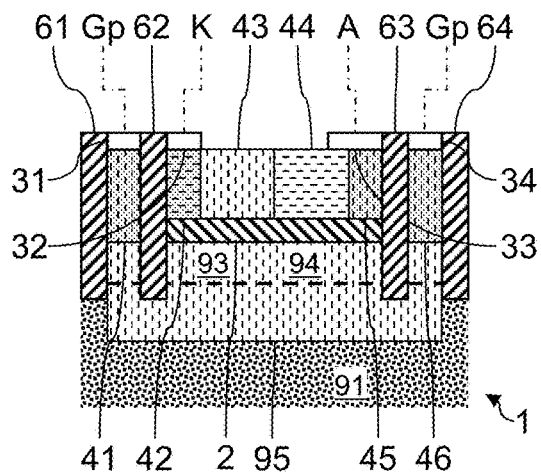

FIG. 9 is a transverse sectional view of a third variant of the device for protecting against electrostatic discharges of the second embodiment. This variant reproduces all the features of the first variant, the only difference being that the metallic contact 33 extends until it is plumb with the base 44, in contact with this base 44. As in the first variant of the first embodiment, the base 43 is devoid of metallic contacts. In this variant, the control of the base 44 is improved, the gain of the pnp transistor is modified (downwards), and this without increasing the bulk of the integrated circuit 1 or increasing the complexity of its fabrication process.

Whatever the form of the metallic contact 33, it can also be envisaged that the metallic contact 32 extends until it is plumb with the base 43, in contact with this base 43.

Figure 10:
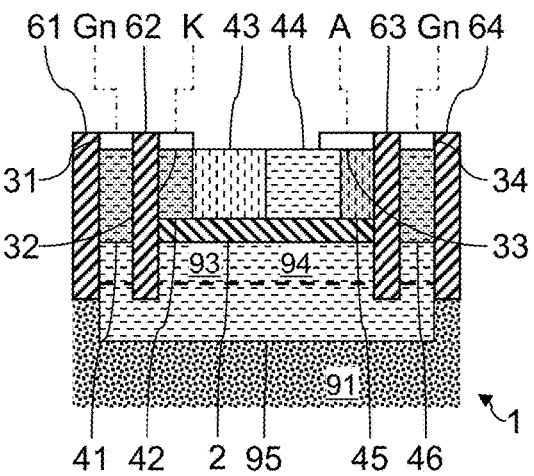

FIG. 10 is a transverse sectional view of a fourth variant of the device for protecting against electrostatic discharges of the second embodiment. This variant reproduces all the features of the third variant, the only difference being that the metallic contact 33 extends until it is plumb with the base 44, in contact with this base 44. As in the third variant of the first embodiment, the base 43 is devoid of metallic contacts. In this variant, the control of the base 44 is improved, the gain of the pnp transistor is modified, and this without increasing the bulk of the integrated circuit 1 or increasing the complexity of its fabrication process.

Whatever the form of the metallic contact 33, it can also be envisaged that the metallic contact 32 extends until it is plumb with the base 43, in contact with this base 43.

Other variants can also be provided on the basis of the first and second variants of the second embodiment. Starting from the first and second variants, provision can be made for the metallic contact 32 to extend until it is plumb with the base 43, in contact with this base 43. The base 44 is then devoid of metallic contacts.

Figure 11:
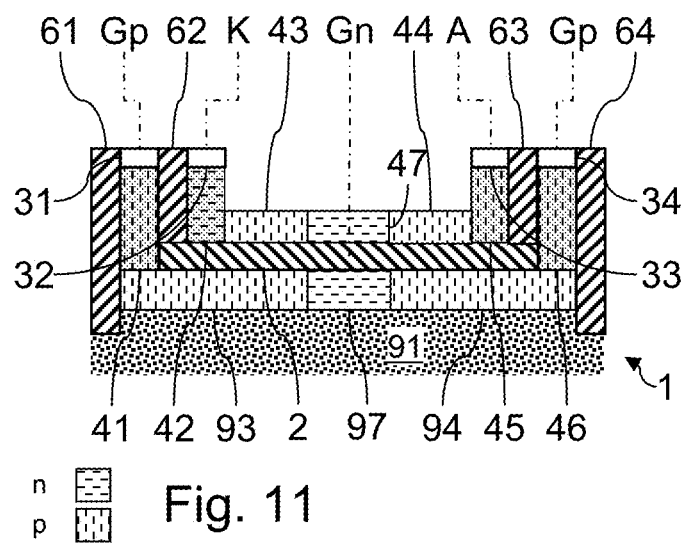
FIG. 11 is a transverse sectional view of a first variant of a third embodiment of a device for protecting against electrostatic discharges according to the invention.

FIG. 11 is a transverse sectional view of a first variant of a device for protecting against electrostatic discharges according to a third embodiment. The third embodiment is intended to form a TRIAC (for Triode Alternating Current) in order to protect the integrated circuit whatever the direction of flow of the electrostatic discharge. In this way two-way protection of the integrated circuit 1 is obtained. The integrated circuit 1 includes other electronic components not illustrated here.

The protection device is formed plumb with a semiconductor substrate 91. This substrate 91 is p-doped for example. The protection device includes a bipolar transistor of npn type and a bipolar transistor of pnp type to form a TRIAC.

The npn transistor includes an emitter 42, a collector 47 and a base 43. The emitter 42 includes an n-doped semiconductor element. The collector 47 comprises an n-doped semiconductor element, and the base 43 comprises a p-doped semiconductor element. The pnp transistor includes an emitter. This emitter includes a first p-doped semiconductor element 45 and a second p-doped semiconductor element 44. The base of the pnp transistor is merged with the collector 47 of the npn transistor (it will therefore be denoted by the reference number 47 hereinafter), and the collector of the pnp transistor is merged with the base 43 of the npn transistor. The emitter 42 and the first semiconductor element 45 advantageously exhibit respective N$^+$-doping and P$^+$-doping. The emitters 42 and 44/45 and the bases 43 and 47 are formed in a semiconductor layer (here made of silicon) arranged on a buried insulant layer 2 exhibiting a thickness less than or equal to 50 nm. The npn and pnp transistors are advantageously coplanar. The semiconductor layer typically exhibits a thickness less than or equal to 15 nm, preferably less than 10 nm, and advantageously less than or equal to 7 nm. Such a semiconductor layer thickness facilitates the electrostatic control of the bases 43 and 47 by ground planes 93 and 97. These thicknesses typically correspond to the thickness of a semiconductor layer on the buried insulant layer 2 before an epitaxial re-growth.

The emitters of the npn and pnp transistors are respectively connected to electrodes K and A of the device for protecting against electrostatic discharges. Metallic contacts 32 and 33 are for this purpose in contact with the emitters of the npn and pnp transistors respectively. The npn and pnp transistors are thus configured to selectively conduct a discharge current between the electrodes K and A.

The device for protecting against electrostatic discharges furthermore comprises a first semiconductor ground plane 93, a second semiconductor ground plane 94 and a third semiconductor ground plane 97.

The first, second and third ground planes 93, 94 and 97 are arranged under the buried insulant layer 2. The first ground plane 93 extends until it is plumb with the base 43. The first ground plane 93 exhibits identical doping to that of the base 43, therefore p-doping. The third ground plane 97 exhibits identical doping to that of the base 47, therefore n-doping.

The second ground plane 94 extends plumb with the emitter including the semiconductor elements 44 and 45. The second ground plane 94 exhibits identical doping to that of these semiconductor elements 44 and 45, therefore p-doping. The ground planes 93, 94 and 97 are electrically biased. The electrical bias of the ground plane 93 is applied by way of a p-doped (and advantageously P$^+$-doped) implanted region 41 and by way of a metallic contact 31. A bias Gp is applied to the metallic contact 31 by way of a bias circuit not illustrated here. The electrical bias of the ground plane 94 is applied by way of a p-doped (and advantageously P$^+$-doped) implanted region 46 and by way of a metallic contact 34. The bias Gp is applied to the metallic contact 34. The electrical bias of the ground plane 97 is applied by way of a non-illustrated n-doped (and preferably N$^+$-doped) implanted region and by way of a metallic contact 35. A bias Gn is applied to the metallic contact 35 by way of the bias circuit.

This device for protecting against electrostatic discharges advantageously includes on its periphery insulation trenches 61 and 64 extending depth-wise up to the substrate 91. The protection device furthermore advantageously includes an insulation trench 62 separating the emitter 42 from the implanted region 41. The insulation trench 62 extends depth-wise up to the buried insulant layer 2. The protection device furthermore advantageously includes an insulation trench 63 separating the emitter of the pnp transistor from the implanted region 46. The insulation trench 63 extends depth-wise up to the buried insulant layer 2. In this variant, the insulation trenches 61 and 64 extend more deeply than the insulation trenches 62 and 63.

The ground planes 93 and 94 extend under the insulation trenches 62 and 63 respectively, until they come into contact with the implanted regions 41 and 46 respectively. The ground plane 97 extends along another axis under a non-illustrated insulation trench until it comes into contact with an implanted region.

Figure 12:
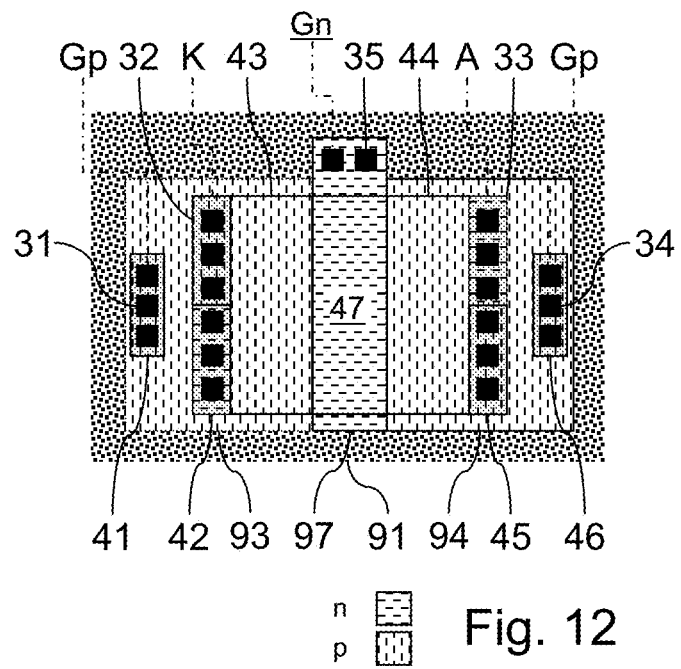
FIG. 12 is a top view of the device in FIG. 11.

FIG. 12 is a top view of the device for protecting against electrostatic discharges of FIG. 11. Out of a concern for legibility, the insulation trenches 61 to 64 have not been illustrated.

The doping density of the bases 43 and 47 is at least ten times smaller than the doping density of the ground planes 93 and 97 respectively. Such doping can be obtained during the respective implantations of the ground planes 93 and 97. In the same way, the density of the second semiconductor element 44 is at least ten times smaller than the doping density of the ground plane 94.

Thus, during an implantation of a ground plane, with a maximum implantation depth arranged under the buried insulant layer 2, the density of doping of the same type in the semiconductor arranged on the buried insulant layer 2 is sufficient to form a base of a bipolar transistor. The lower the residual doping of the bases 43 and 47 at the end of this implantation, the more low bias voltage levels can be applied to the ground planes 93 and 97. The doping of the bases 43 and 47 typically exhibits a density of less than $10^{18}$ cm$^{-3}$, preferably of less than $5*10^{17}$ cm$^{-3}$. To increase the influence of the electrostatic control of a ground plane on the base arranged plumb with it, the buried insulant layer advantageously exhibits a thickness of less than or equal 25 nm, or even less than or equal to 15 nm.

In this variant, the upper face of the bases 43 and 47 and of the semiconductor element 44 is in recess with respect to the upper face of the emitter 42 and of the semiconductor element 45. The formation of the emitter 42 and of the semiconductor element 45 can for example be continued in an epitaxial re-growth phase.

Figure 13:
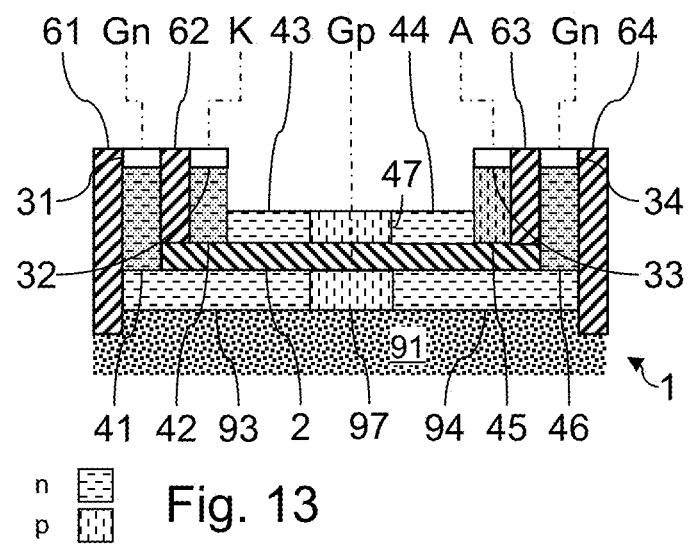
FIG. 13 is a transverse sectional view of a second variant of a third embodiment of a device for protecting against electrostatic discharges according to the invention.
Figure 14:
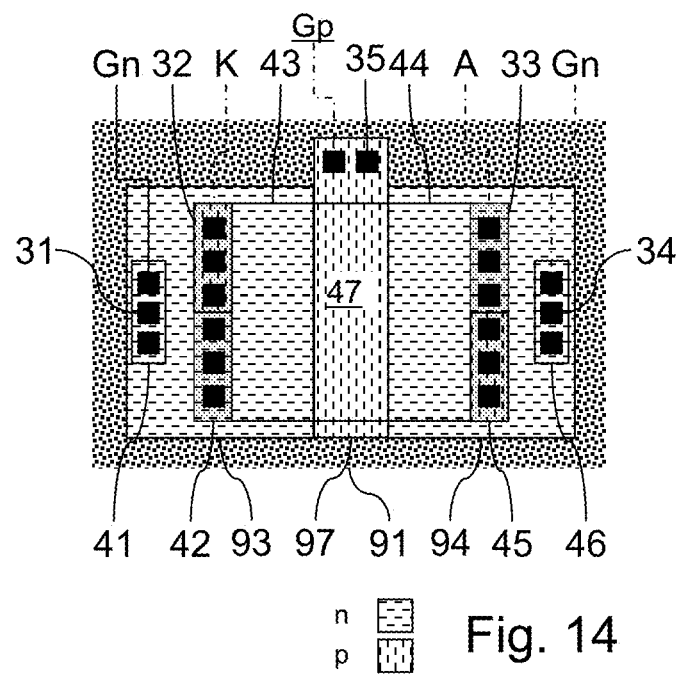
FIG. 14 is a top view of the device in FIG. 13.

FIG. 13 is a transverse sectional view of a second variant of a device for protecting against electrostatic discharges according to a third embodiment. FIG. 14 is a top view of the device for protecting against electrostatic discharges of FIG. 13. For the sake of legibility, the insulation trenches 61 to 64 have not been illustrated.

This variant reproduces all the features of the first variant, the main differences being that:
 the emitter of the npn transistor comprises a semiconductor element 42 and a semiconductor element 43;
 the semiconductor element 47 forms the base of the npn transistor;
 the semiconductor element 45 forms the emitter of the pnp transistor;
 the semiconductor element 44 forms the base of the pnp transistor;
 the doping of the implanted regions 41, 46, of the base 44, of the semiconductor elements 42 and 43 and of the ground planes 93 and 94 is n-type;
 the doping of the base 47, of the emitter 45 and of the ground plane 97 is p-type;
 a bias $V_{Gn}$ is applied to the ground plane 97;
 a bias $V_{Gp}$ is applied to the ground planes 93 and 94.

Figure 15:
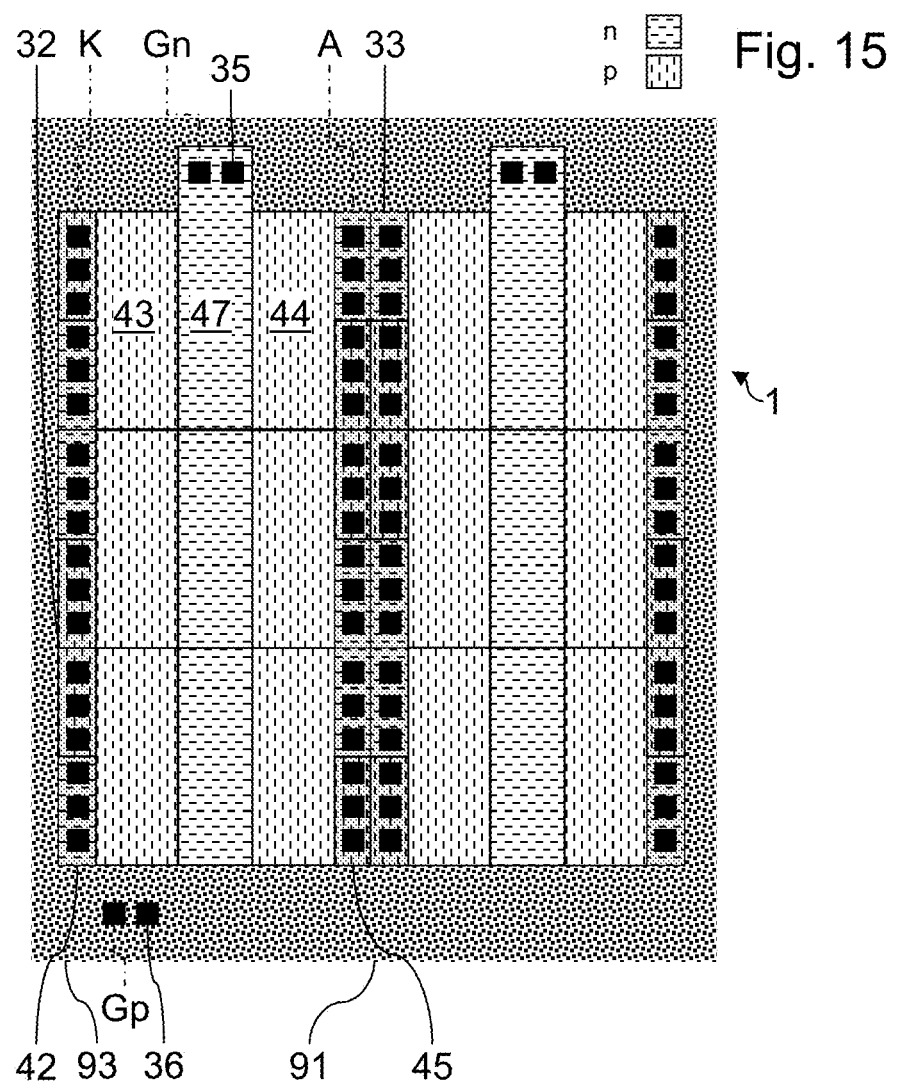
FIG. 15 is a top view of a set of devices according to FIG. 11 placed side by side in an integrated circuit.

FIG. 15 is a top view of a set of protection devices according to FIG. 11 placed side by side in an integrated circuit 1. This figure makes it possible to observe that the bias of the ground planes 97 by way of metallic contacts can be produced in a common manner for several devices for protecting against discharges, with a minimum of bulk.

Although not illustrated, it can also be envisaged that the insulation trenches 61 to 64 of the third embodiment exhibit one and the same depth. It can also be envisaged that the upper faces of the semiconductor elements 43, 44 and 47 are flush with the upper faces of the emitters 42 and 45. The doping of one of the semiconductor elements 43, 44 or 47 can also be of LDD type.

Figure 16:
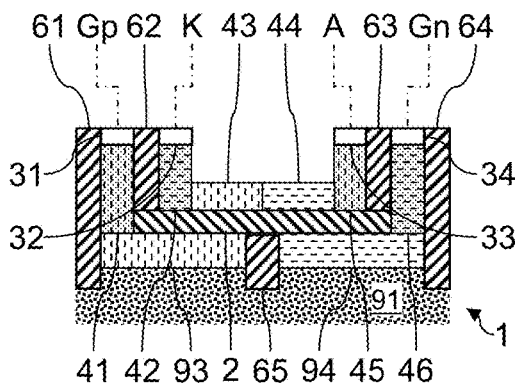
FIGS. 16 to 17 are transverse sectional views of different variants of a fourth embodiment of a device for protecting against electrostatic discharges according to the invention.

FIG. 16 is a transverse sectional view of an integrated circuit 1, at the level of a device for protecting against electrostatic discharges according to a first variant of a fourth embodiment of the invention. The integrated circuit 1 includes other electronic components not illustrated here.

This variant differs from the first variant of the first embodiment solely by the presence of an insulation element 65 extending between the buried insulant layer 2 and the substrate 91. The insulation element 65 is positioned plumb with the contact between the bases 43 and 44. The insulation element 65 extends into the substrate 91 more deeply than the ground planes 93 and 94. The element 65 extends here to the same depth as the insulation trenches 61 and 64. The insulation element 65 electrically insulates the ground planes 93 and 94 from each other. Such an insulation makes it possible to reduce leaks between the ground planes 93 and 94 and also to reduce parasitic capacitances with the aim of improving performance at high frequencies. Moreover, it is possible to use a wider variety of bias potentials on the ground planes 93 and 94.

In this embodiment, the projections of the ground planes 93 and 94 on the layer 2 (along a normal to the layer 2) do not include the respective projections of the bases 43 and 44 on this layer 2. However, a sufficient proportion of the ground planes 93 and 94 remains plumb with the bases 43 and 44 respectively, to guarantee electrostatic control of the latter. In particular, the ground planes 93 and 94 extend plumb with the emitter 42/base 43 and emitter 45/base 44 contacts respectively.

Figure 17:
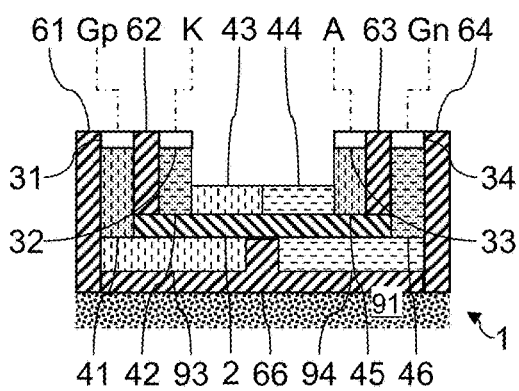

FIG. 17 is a transverse sectional view of an integrated circuit 1, at the level of a device for protecting against electrostatic discharges according to a second variant of the fourth embodiment of the invention. This variant differs from the first variant in that it furthermore comprises another buried insulant layer 66, arranged under the ground planes 93 and 94 and extending between the insulation trenches 61 and 64. The buried insulant layer 66 electrically insulates the ground planes 93 and 94 from the substrate 91. The layer 66 also exhibits a projecting part between the ground planes 93 and 94 extending up to the buried insulant layer 2, so as to insulate the ground planes 93 and 94 from each other. Due to the insulation with respect to the substrate 91, a bias voltage of the ground plane 93 greater than the bias voltage of the ground plane 94 is possible.

In the different variants, the substrate 91 and the semiconductor layers are made of silicon; however other semiconductor materials can also be used.

By taking measurements, it has been possible to verify a very linear relationship between the bias voltage of a ground plane under a base and the triggering voltage of a device for protecting against electrostatic discharges according to the invention. It has been possible to observe that a bias voltage of a ground plane exhibiting a normal logic level furthermore makes it possible to obtain a triggering voltage of the protection device greater than this logic level.

Figure 26:
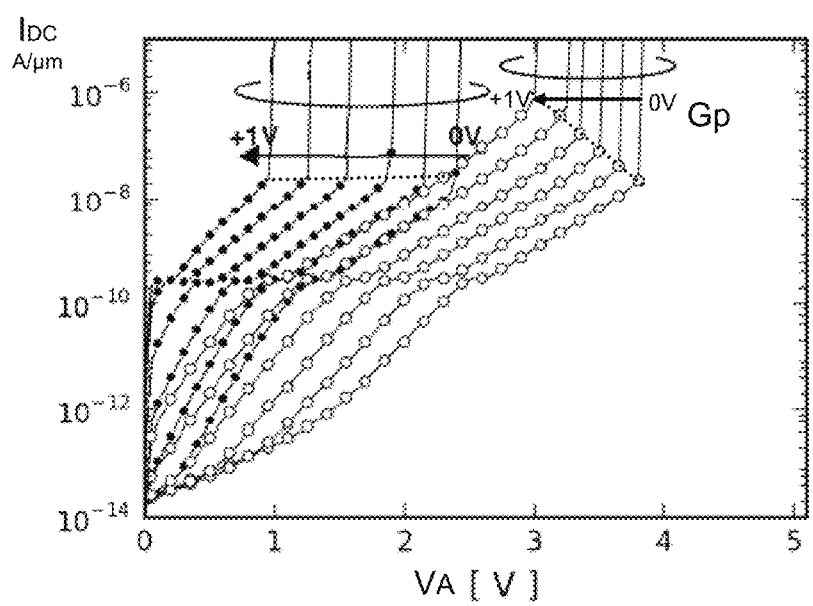
FIG. 26 illustrates diagrams of measurements of current density as a function of the anode voltage, for various ground plane bias voltages.

Measurements were also carried out with an integrated circuit corresponding to the first variant of the second embodiment, as well as with another variant of this second embodiment. FIG. 26 supplies diagrams illustrating the current density $I_A$ as a function of the anode voltage ($V_A$), for various bias voltages $V_{Gp}$ of the ground plane placed under the p-doped base. The diagrams of the left part of the figure correspond to the first variant of the second embodiment, with floating bases. The diagrams of the right part of the figure correspond to a declension of this first variant of the second embodiment, in which the metallic cathode 32 in contact with the implanted region 42 projects until it comes into contact with the base 43.

This diagram confirms the great linearity between the bias voltage Gp and the triggering voltage Vt1 (the triggering voltage is deduced from the diagrams at the intersection of the latter and a dotted segment), whether this is for a positive or negative voltage Gp. It is furthermore noted that the control by a voltage Gp comprised between 0 and +1 V makes it possible to obtain a triggering voltage Vt1 comprised between 1 and 3.9 V, according to whether the base 43 is floating or short-circuited at the metallic cathode 32.

In the different detailed variants, the bases are not connected to a circuit for controlling the base currents.

The invention claimed is:

1. An integrated circuit comprising a device for protecting against electrostatic discharges, the protection device comprising a buried insulant layer having a thickness of less than or equal to 50 nm, first and second bipolar transistors arranged on the buried insulant layer, one of the first and second bipolar transistors being an npn transistor, the other of the first and second bipolar transistors being a pnp transistor, the base of the first bipolar transistor being merged with the collector of the second bipolar transistor and the base of the second bipolar transistor being merged with the collector of the first bipolar transistor, the first and second bipolar transistors being configured for selectively conducting a discharge current between two electrodes of the protection device, a first semiconductor ground plane arranged under the buried insulant layer, wherein said ground plane is capable of being electrically biased, wherein said ground plane extends plumb with the base of the first bipolar transistor, wherein said round plane has a first type of doping that is identical to that of the base of the first bipolar transistor, and wherein the ground plane has a doping density that is at least ten times greater than that of the base of the first bipolar transistor, an FDSOI transistor formed on said buried insulant layer, and a semiconductor ground plane arranged under said buried insulant layer, plumb with said FDSOI transistor.

2. The integrated circuit of claim 1, wherein the doping density in the base of the first bipolar transistor is less than or equal to $10^{18}$ cm$^{-3}$.

3. The integrated circuit of claim 1, wherein the bases of the first and second bipolar transistors are formed in a semiconductor layer exhibiting a thickness less than or equal to 15 nm.

4. The integrated circuit of claim 1, further comprising a second semiconductor ground plane arranged under the buried insulant layer, said second semiconductor ground plane being electrically biased, exhibiting a second type of doping, and extending plumb with the base of the second bipolar transistor, said first and second types of doping being different.

5. The integrated circuit of claim 1, wherein said second bipolar transistor includes an electrode in contact with its base.

6. The integrated circuit of claim 4, wherein said first and second ground planes are in contact.

7. The integrated circuit or claim 6, wherein respective projections of the first and second ground planes on the buried insulant layer include respective projections of the bases of the first and second bipolar transistors on the buried insulant layer.

8. The integrated circuit of claim 4, further comprising an electrically insulating element, the electrically insulating element separating the first and second ground planes and being arranged plumb with a junction between the base of the first bipolar transistor and the base of the second bipolar transistor.

9. The integrated circuit of claim 8, further comprising a semiconductor substrate, wherein said electrically insulating element includes another buried insulant layer arranged between said semiconductor substrate and said first and second ground planes.

10. The integrated circuit of claim 1, wherein said first bipolar transistor has no electrode in contact with its base.

11. The integrated circuit of claim 1, wherein the bases of said first and second bipolar transistors have upper faces, wherein the emitters of said first and second bipolar transistors have upper faces, and wherein the upper faces of the bases and emitters are flush.

12. A process for fabricating an integrated circuit including a device for protecting against electrostatic discharges, the process comprising forming a first ground plane, wherein forming the first ground plane comprises implanting a first type of dopant in a semiconductor substrate arranged under a buried insulant layer, the buried insulant layer having a thickness less than or equal to 50 nm, wherein said method further comprises forming first and second bipolar transistors on the buried insulant layer, wherein one of the first and second transistors is an npn transistor and the other is a pnp transistor, and wherein, the base of the first transistor exhibits the first type of doping, the respective bases of the first and second bipolar transistors being merged with the respective collectors of the second and first bipolar transistors, the base of the first bipolar transistor being formed plumb with the first ground plane, the doping of the base of the first transistor being performed during the implantation of the first type of doping for the formation of said first ground plane, the doping density at the end of the implantation in the first ground plane being at least ten times greater than that of the base of the first bipolar transistor, forming an FDSOI transistor on said buried insulant layer, and arranging a semiconductor ground plane under said buried insulant layer, plumb with said FDSOI transistor.

13. The process of claim 12, further comprising forming an electrode that is electrically connected to said first ground plane and interconnecting said electrode with a bias circuit.

14. The process of claim 13, further comprising selecting the doping density in the base of the first transistor after forming the interconnect with the bias circuit to be less than or equal to $10^{18}$ cm$^{-3}$.

15. The process of claim 12, further comprising forming the first and second bipolar transistors in a semiconductor layer arranged on said buried insulant layer, and executing a plurality of dopant-implanting steps, each of which comprises implanting a dopant in the semiconductor layer, wherein execution of the implanting steps occurs subsequent to the implantation for the formation of said first ground plane, wherein each of the implanting steps comprises masking the base of the first bipolar transistor.

16. The process of claim 13, further comprising causing the base of said first bipolar transistor to avoid contact with the electrode.

* * * * *